(12) United States Patent
Kim et al.

(10) Patent No.: US 11,249,339 B2
(45) Date of Patent: Feb. 15, 2022

(54) DISPLAY DEVICE HAVING A MIRROR FUNCTION

(71) Applicant: LG Display Co., Ltd., Seoul (KR)

(72) Inventors: Changsoo Kim, Paju-si (KR); Euitae Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 276 days.

(21) Appl. No.: 16/518,799

(22) Filed: Jul. 22, 2019

(65) Prior Publication Data

US 2020/0033676 A1    Jan. 30, 2020

(30) Foreign Application Priority Data

Jul. 24, 2018  (KR) .................. 10-2018-0086181

(51) Int. Cl.
| | | |
|---|---|---|
| *G02F 1/1335* | (2006.01) | |
| *G02F 1/1362* | (2006.01) | |
| *G02F 1/1368* | (2006.01) | |
| *H01L 51/52* | (2006.01) | |
| *H01L 27/32* | (2006.01) | |

(52) U.S. Cl.
CPC ...... *G02F 1/133553* (2013.01); *G02F 1/1368* (2013.01); *G02F 1/136213* (2013.01); *H01L 27/3216* (2013.01); *H01L 27/3218* (2013.01); *H01L 27/3244* (2013.01); *H01L 51/5218* (2013.01); *H01L 51/5253* (2013.01); *H01L 51/5271* (2013.01); *G02F 1/133514* (2013.01); *G02F 2201/52* (2013.01)

(58) Field of Classification Search
CPC ......... G02F 1/133553; G02F 1/136213; G02F 1/1368; H01L 27/3216; H01L 27/3218; H01L 27/3244; H01L 51/5218; H01L 51/5253; H01L 51/5271
USPC ........................................................ 257/88
See application file for complete search history.

(56) References Cited

U.S. PATENT DOCUMENTS

| | | | |
|---|---|---|---|
| 6,040,936 A | 3/2000 | Kim et al. | |
| 7,375,463 B2 | 5/2008 | Uemura et al. | |
| 8,330,904 B2 | 12/2012 | Yoon | |
| 8,933,443 B2 | 1/2015 | Yim et al. | |
| 9,028,071 B2 | 5/2015 | Natsumeda et al. | |
| 9,991,474 B2 | 6/2018 | Kim et al. | |
| 10,044,002 B2 | 8/2018 | Lee et al. | |
| 10,079,363 B2 | 9/2018 | Lee et al. | |

(Continued)

FOREIGN PATENT DOCUMENTS

| | | |
|---|---|---|
| EP | 2496052 A1 | 9/2012 |
| JP | 2000-111851 | 4/2000 |

(Continued)

OTHER PUBLICATIONS

Office Action, Korean Patent Application No. 10-2018-0086181, dated Dec. 9, 2019, 15 pages.

*Primary Examiner* — Matthew E. Gordon
(74) *Attorney, Agent, or Firm* — Fenwick & West LLP

(57) ABSTRACT

A display device having a mirror function includes a first substrate, a light emitting portion, a second substrate, a mirror portion, and a cover layer. The light emitting portion is on a surface of the first substrate. The mirror portion is on a surface of the second substrate facing the first substrate and has an opening overlapping the light emitting portion. The cover layer is on a surface of the second substrate and covers a portion of the opening.

20 Claims, 22 Drawing Sheets

(56) References Cited

U.S. PATENT DOCUMENTS

| | | | |
|---|---|---|---|
| 10,224,513 | B2 | 3/2019 | Kim et al. |
| 2006/0055319 | A1 | 3/2006 | Uemura et al. |
| 2011/0149214 | A1* | 6/2011 | Yoon ................ G02F 1/133514 |
| | | | 349/106 |
| 2012/0224148 | A1 | 9/2012 | Natsumeda et al. |
| 2014/0299850 | A1 | 10/2014 | Yim et al. |
| 2016/0308168 | A1 | 10/2016 | Lee et al. |
| 2017/0104182 | A1 | 4/2017 | Kim et al. |
| 2017/0214003 | A1* | 7/2017 | Lee .................... H01L 51/5271 |
| 2018/0254437 | A1 | 9/2018 | Kim et al. |

FOREIGN PATENT DOCUMENTS

| | | |
|---|---|---|
| JP | 2013-004964 A | 1/2013 |
| JP | 5527327 B2 | 6/2014 |
| JP | 2017-084791 A | 5/2017 |
| KR | 10-2006-0027330 | 3/2006 |
| KR | 10-2011-0070571 A | 6/2011 |
| KR | 10-2014-0122132 A | 10/2014 |
| KR | 10-2016-0038112 A | 4/2016 |
| KR | 10-2016-0124362 A | 10/2016 |
| KR | 10-2017-0041950 A | 4/2017 |
| KR | 10-2017-0088457 A | 8/2017 |

\* cited by examiner (A)    (B)

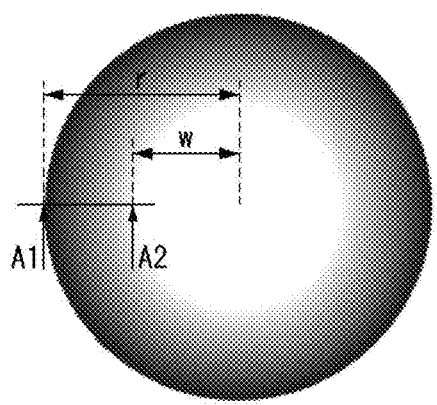
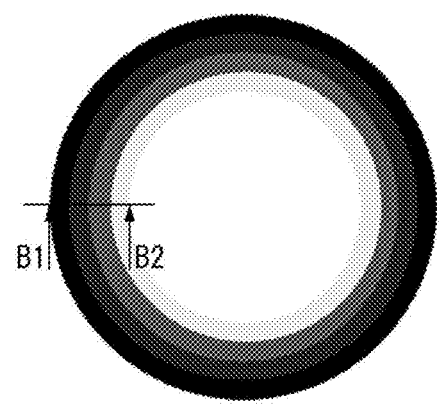
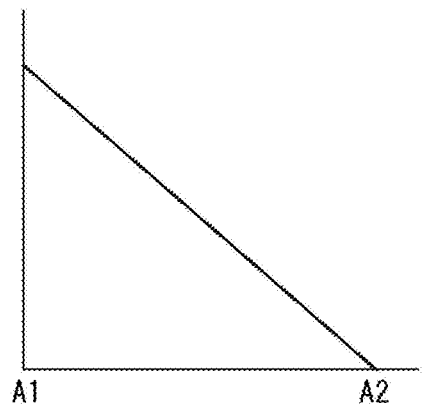
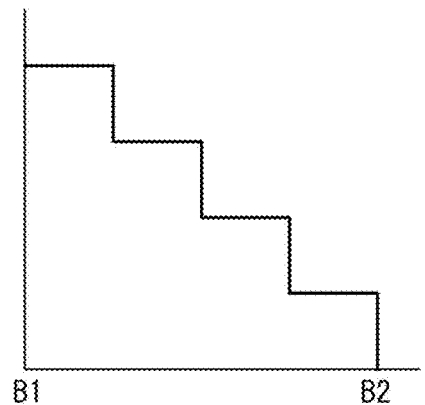
Fig. 20A
Fig. 20B

| | Triangle | Diamond | Rectangle | Circle |
|---|---|---|---|---|
| top mirror structure |  |  |  |  |
| Simulation * (two-dimensional Fourier Transform) |  |  |  |  |

| | Triangle | Diamond | Rectangle | Circle |
|---|---|---|---|---|
| top mirror structure |  |  |  |  |
| Simulation * (two-dimensional Fourier Transform) |  |  |  |  |

DISPLAY DEVICE HAVING A MIRROR FUNCTION

CROSS REFERENCE TO RELATED APPLICATION

This application claims the benefit of Republic of Korea Patent Application No. 10-2018-0086181, filed on Jul. 24, 2018, which is incorporated herein by reference for all purposes in its entirety.

BACKGROUND OF THE DISCLOSURE

Field of the Disclosure

The present disclosure relates to a display device having a mirror function.

Related Art

With the development of information technology, the market of display devices, connection mediums between users and information, has grown. Accordingly, the use of display devices such as organic light emitting displays, quantum dot displays (QDD), and liquid crystal displays (LCD) is on the increase.

The display device includes a display panel including a plurality of subpixels arranged in a form such as a matrix or the like, a driver outputting a driving signal for driving the display panel, and a power supply unit generating power to be supplied to the display panel or the driver. The driver includes a scan driver supplying a scan signal (or gate signal) to the display panel and a data driver supplying a data signal to the display panel.

When the driving signal, such as a scan signal and a data signal, is supplied to the subpixels formed on the display panel, the selected subpixels allow light to be transmitted therethrough or emit light directly to display an image.

The display device described above has a function of mirroring a shape of a person or an object in the display panel and a function of displaying image information, which is termed a bi-functional mirror display, thus being realized as a display device having a mirror function. The display device having such a function may display a specific image together with a shape of a person or an object, and as such, display devices have been developed and realized in various forms.

SUMMARY OF THE DISCLOSURE

The present disclosure provides a display device having a mirror function including a first substrate, a light emitting portion, a second substrate, a mirror portion, and a cover layer. The light emitting portion is on a surface of the first substrate. The mirror portion is on a surface of the second substrate facing the first substrate, and the mirror portion has an opening overlapping the light emitting portion. The cover layer has at least a part on the surface of the second substrate facing the first substrate and covering a portion of the opening.

In one embodiment, another part of the cover layer is on a surface of the mirror portion facing the first substrate. The another part has a substantially flat surface, and the part covering the portion of the opening has a sloped surface.

In one embodiment, a thickness of the cover layer gradually decreases toward a center region of the opening.

In one embodiment, the cover layer has a stepped shape, and a thickness of the cover layer decreases toward a center region of the opening.

In one embodiment, a thickness of the cover layer decreases toward a center region of the opening from a point overlapping with the mirror portion, a point at a boundary between the mirror portion and the second substrate, or a point beyond the boundary toward the center region of the opening.

In one embodiment, the cover layer further includes a pattern of fine openings in the part covering the portion of the opening.

In one embodiment, sizes of the fine openings increase toward a center region of the opening.

In one embodiment, a shape of the cover layer in a plan view corresponds to a shape of the opening.

In one embodiment, a shape of the cover layer in a plan view is one of circular, elliptical, triangular, quadrangular, and polygonal shapes or a combination thereof.

In one embodiment, the cover layer includes one or more layers, each of the one or more layers formed of an organic material, an inorganic material, or a metal material.

In another aspect, the present disclosure provides a display device including a first substrate, a light emitting portion, a second substrate, a mirror portion and a cover layer. The light emitting portion is on a surface of the first substrate. The mirror portion is on a surface of the second substrate facing the first substrate, and the mirror portion has an opening overlapping the light emitting portion. The cover layer has a first region on the second substrate and a second region on the mirror portion. The cover layer has a first thickness at a first location and a second thickness at a second location farther from a center region of the opening than the first location.

In one embodiment, the first region of the cover layer covers a portion of the opening.

In one embodiment, the first location and the second location are in the first region, and the second thickness is greater than the first thickness.

In one embodiment, the cover layer has a third thickness at a third location and a fourth thickness at a fourth location farther from the center region of the opening than the third location. The third location and the fourth location are in the second region, and the fourth thickness is greater than the third thickness.

In one embodiment, the cover layer has a third thickness at a third location and a fourth thickness at a fourth location farther from the center region of the opening than the third location. The third location and the fourth location are in the second region, and the fourth thickness is equal to the third thickness.

In one embodiment, a distance between the surface of the second substrate facing the first substrate and a surface of the cover layer is substantially equal at the second location, the third location, and the fourth location.

In one embodiment, the first location and the second location are in the first region, and the second thickness is equal to the first thickness.

In one embodiment, the cover layer further includes a pattern of fine openings in the first region, sizes of the fine openings increasing toward a center region of the opening. In another aspect, the present disclosure provides a display device comprising a plurality of subpixels. Each subpixel comprises an emission area for emitting light and a reflective area surrounding the emission area. The reflective area includes a mirror portion and the emission area includes an opening in the mirror portion. The cover layer is on at least a portion of the mirror portion and extends into the opening to overlap with a portion of the emission area.

In one embodiment, a thickness of the cover layer gradually decreases toward a center region of the opening.

In one embodiment, the cover layer has a step shape, and a thickness of the cover layer decreases toward a center region of the opening.

In one embodiment, a thickness of the cover layer decreases toward a center region of the opening from a point overlapping with the reflective area, a point at a boundary between the reflective area and the emission area, or a point beyond the boundary toward the center region.

In one embodiment, the cover layer further includes a pattern of fine openings in a part extending into the opening to overlap with the portion of the emission area.

In one embodiment, a shape of the cover layer in a plan view corresponds to a shape of the opening.

BRIEF DESCRIPTION OF THE DRAWINGS

FIGS. 20A-20B are planar and cross-sectional views of two types of cover layers.

DESCRIPTION OF EMBODIMENTS

Hereinafter, embodiments of the present disclosure will be described with reference to the accompanying drawings.

With the development of information technology, the market of display devices, connection mediums between users and information, has grown. Accordingly, the use of display devices such as organic light emitting displays, quantum dot displays (QDD), and liquid crystal displays (LCD) is on the increase.

Hereinafter, for the purposes of description, a liquid crystal display (LCD) device and the organic light emitting display device will be described as an example related to the present disclosure. However, the present disclosure described below may also be applicable to an inorganic light emitting diode-based display device other than an organic light emitting diode.

Figure 1:
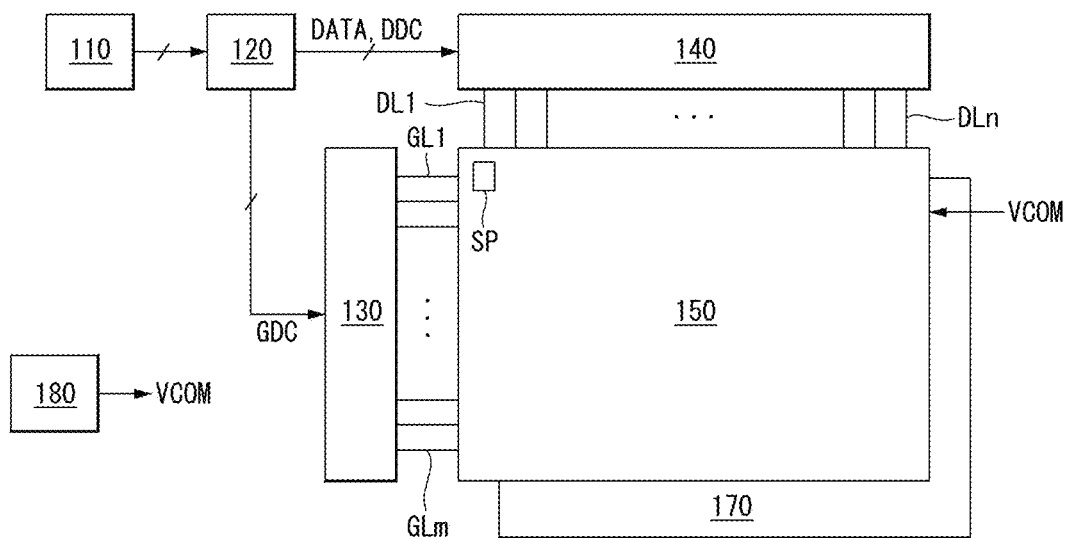
FIG. 1 is a block diagram schematically illustrating a liquid crystal display device.
Figure 2:
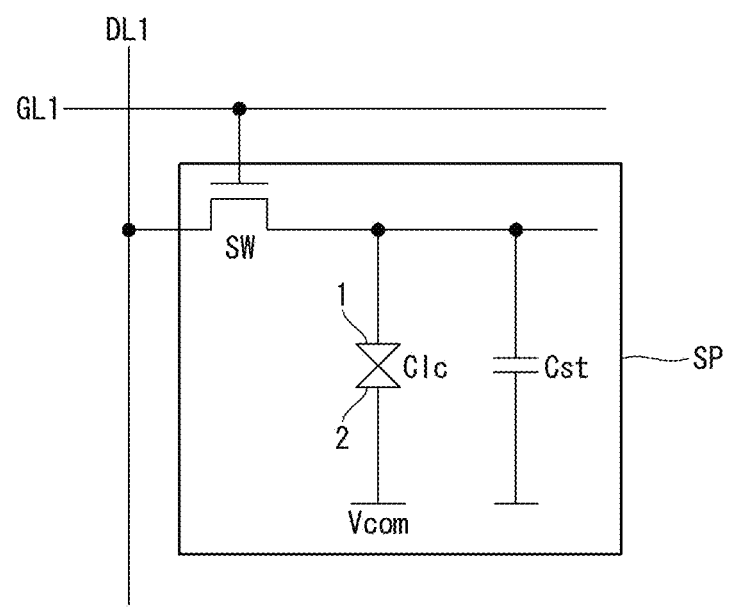
FIG. 2 is a circuit diagram schematically illustrating a subpixel illustrated in FIG. 1.

FIG. 1 is a block diagram schematically illustrating an LCD device, and FIG. 2 is a circuit diagram schematically illustrating a subpixel of FIG. 1.

As illustrated in FIGS. 1 and 2, an LCD device includes an image supply unit 110, a timing controller 120, a scan driver 130, a data driver 140, a display panel 150, a backlight unit 170, a power supply unit 180, and the like.

The image supply unit 110 outputs various driving signals in addition to an image data signal supplied from the outside or an image data signal stored in an internal memory. The image supply unit 110 supplies a data signal and various driving signals to the timing controller 120.

The timing controller 120 outputs a gate timing control signal GDC for controlling an operation timing of the scan driver 130 and a data timing control signal DDC for controlling an operation timing of the data driver 140. The timing controller 120 supplies, to the data driver 140 together with the data timing control signal DDC, the data signal (or data voltage) DATA supplied from the image supply unit 110.

The scan driver 130 outputs a scan signal (or a gate signal) in response to the gate timing control signal GDC supplied from the timing controller 120. The scan driver 130 supplies the scan signal to the subpixels included in the display panel 150 through gate lines GL1 to GLm. The scan driver 130 is formed as an integrated circuit (IC) or directly formed on the display panel 150 in a gate-in-panel manner.

In response to the data timing control signal DDC supplied from the timing controller 120, the data driver 140 samples and latches the data signal DATA and converts the data signal into an analog data voltage corresponding to a gamma reference voltage to output the same. The data driver 140 supplies the data voltage to the subpixels included in the display panel 150 through the data lines DL1 to DLn. The data driver 140 may be formed as an IC but is not limited thereto.

The power supply unit 180 generates and outputs a common voltage VCOM based on an external input voltage supplied from the outside. The power supply unit 180 may generate and output a voltage (e.g., scan high voltage or scan low voltage) required for driving the scan driver 130 or a voltage (drain voltage or half drain voltage) required for driving the data driver 140, etc., as well as a common voltage VCOM.

The display panel 150 displays an image in response to the scan signal supplied from the scan driver 130, the data voltage supplied from the data driver 140, and the common voltage VCOM supplied from the power supply unit 180. The subpixels of the display panel 150 control light provided through a backlight unit 170.

For example, one subpixel SP includes a switching transistor SW, a storage capacitor Cst, and a liquid crystal layer Clc. A gate electrode of the switching transistor SW is connected to the scan line GL1 and a source electrode thereof is connected to the data line DL1. One end of the storage capacitor Cst is connected to a drain electrode of the switching transistor SW and the other end thereof is connected to a common voltage line Vcom. The liquid crystal layer Clc is formed between a pixel electrode 1 connected to the drain electrode of the switching transistor SW and a common electrode 2 connected to the common voltage line Vcom.

The display panel 150 is implemented as a twisted nematic (TN) mode, a vertical alignment (VA) mode, an in-plane switching (IPS) mode, a fringe field switching (FFS) mode or an electrically controlled birefringence (ECB) mode depending on a structure of the pixel electrode 1 and the common electrode 2.

The backlight unit 170 provides light to the display panel 150 using a light source or the like that emits light. The backlight unit 170 includes a light emitting diode (LED), an LED driver for driving the LED, an LED board on which the LED is mounted, a light guide plate for converting light exiting from the LED into a surface light source, a reflector reflecting light from a lower portion of the light guide plate, optical sheets for collecting and spreading light exiting from the light guide plate, but are not limited thereto.

Figure 3:
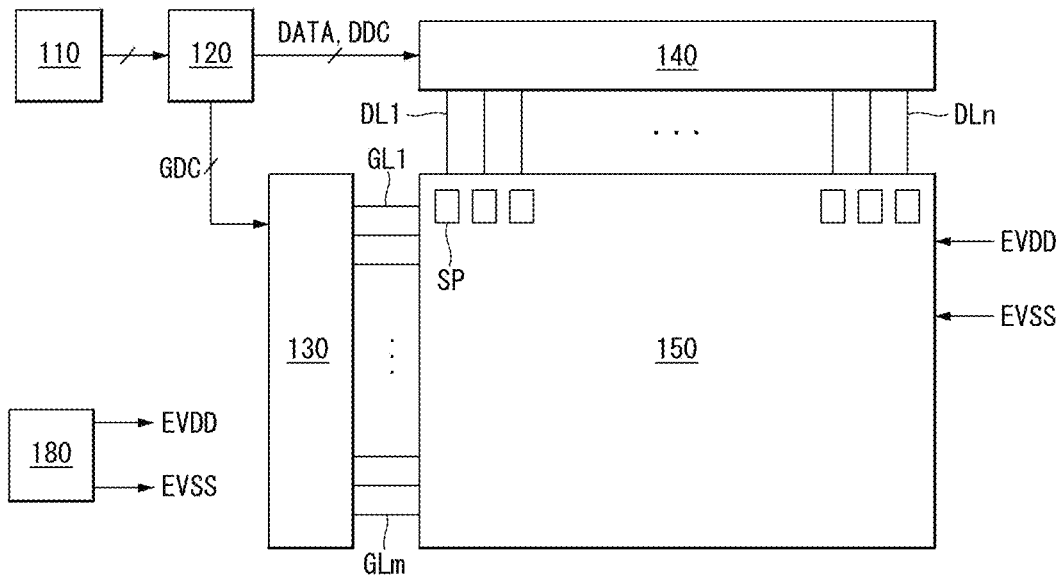
FIG. 3 is a block diagram schematically illustrating an organic light emitting display device.
Figure 4:
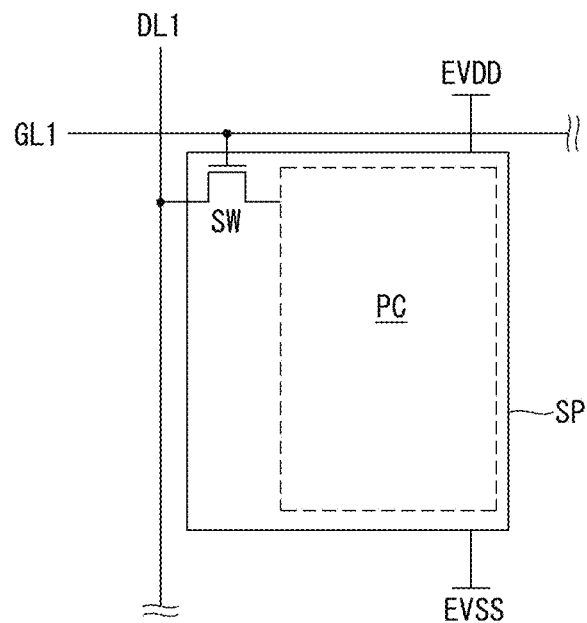
FIG. 4 is a view schematically illustrating a subpixel of FIG. 3.

FIG. 3 is a block diagram schematically illustrating an organic light emitting display device, and FIG. 4 is a schematic diagram illustrating a subpixel of FIG. 3.

As illustrated in FIGS. 3 and 4, the organic light emitting display device includes an image supply unit 110, a timing controller 120, a scan driver 130, a data driver 140, a display panel 150, a power supply unit 170, and the like.

The image supply unit 110, the timing controller 120, the scan driver 130, the data driver 140, and the like, included in the organic light emitting display device are similar in basic structure and operation to the liquid crystal display of FIG. 1, and thus, a detailed description thereof will be omitted. The power supply unit 180 and the display panel 150, which are significantly distinguished from the liquid crystal display, will be described in detail.

The power supply unit 180 generates and outputs a first power source EVDD having a high potential and a second power EVSS having a low potential based on an external input voltage supplied from the outside. The power supply unit 180 may generate and output a voltage (e.g., scan high voltage or scan low voltage) required for driving the scan driver 130 or a voltage (drain voltage or half-drain voltage) required for driving the data driver 140, as well as the first and second powers EVDD and EVSS.

The display panel 150 displays an image in response to a scan signal output from a driver including the scan driver 130 and the data driver 140, a driving signal including a data voltage, and the first and second powers EVDD and EVSS output from the power supply unit 170. The subpixels of the display panel 150 emit light directly.

For example, one subpixel SP includes a pixel circuit PC including a switching transistor SW and a driving transistor, a storage capacitor, and an organic light emitting diode (OLED). The subpixel SP used in the organic light emitting display device, which directly emits light, is complex in circuit configuration compared to a liquid crystal display device. In addition, a compensation circuit for compensating for deterioration of a driving transistor that supplies a driving current to the organic light emitting diode, as well as the organic light emitting diode that emits light, and the like, are complicated and vary. Thus, it is noted that the pixel circuit PC included in the subpixel SP is illustrated in a block form.

The display device described above has a function of mirroring a shape of a person or an object in the display panel and a function of displaying image information, which is termed a bi-functional mirror display, thus being realized as a display device having a mirror function. The display device having such a function may display a specific image together with a shape of a person or an object, and as such, display devices have been developed and realized in various forms.

Figure 5:
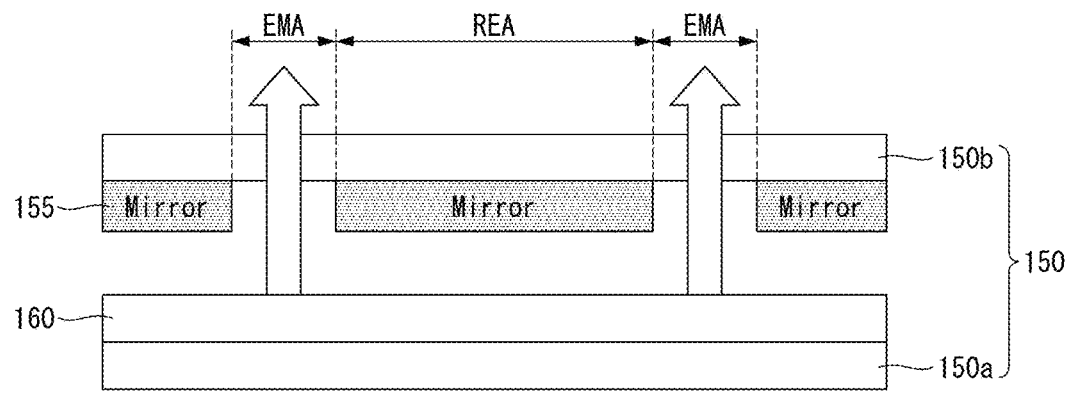
FIG. 5 is a cross-sectional view for helping structural understanding of a mirror function display panel.
Figure 6A:
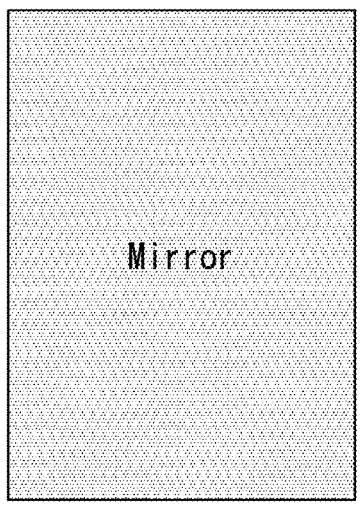
FIGS. 6A-6B and 7A-7B are views for helping functional understanding of a mirror function display panel.
Figure 6B:
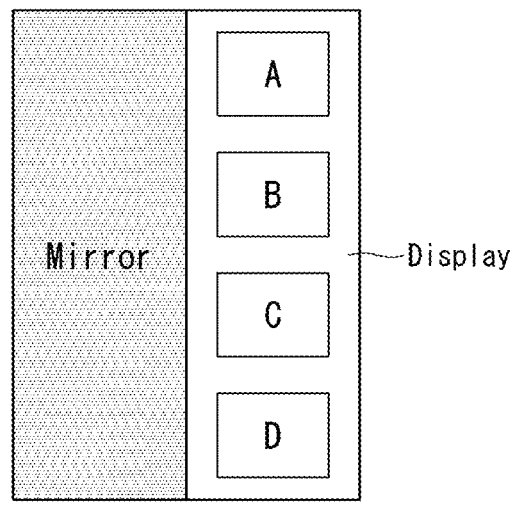
Figure 7A:
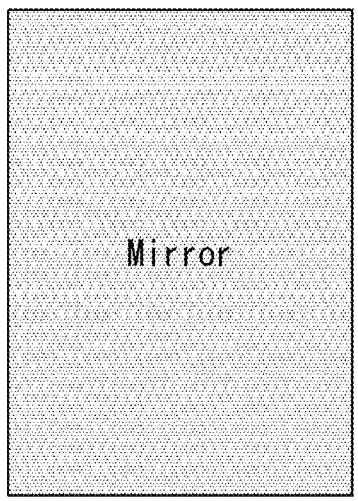
Figure 7B:
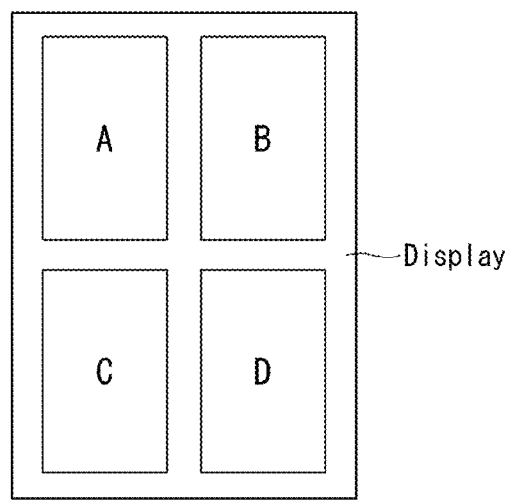

FIG. 5 is a cross-sectional view for helping structural understanding of a mirror function display panel, and FIGS. 6 and 7 are views for helping functional understanding of the mirror function display panel.

As illustrated in FIG. 5, a mirror function display panel 150 includes a first substrate 150a, a display circuit portion 160, a mirror portion 155, and a second substrate 150b. The display circuit portion 160 is positioned on one surface of the first substrate 150a. The mirror portion 155 is positioned on one surface of the second substrate 150b facing the display circuit portion 160. The first substrate 150a and the second substrate 150b are sealed together.

The display circuit portion 160 includes scan lines, data lines, power supply lines, and the like, in addition to subpixels that operate to display an image on the mirror function display panel 150. The subpixels include a liquid crystal layer allowing light generated from a lower portion to be transmitted or blocking the light or a light emitting diode which emits light or does not.

The mirror portion 155 is disposed and divided on one surface of the second substrate 150b. The mirror portion 155 is formed of a metal having excellent (or good) reflectivity. An area where the mirror portion 155 is positioned is defined as a reflective area REA that reflects light and an area where the mirror portion 155 is not positioned is defined as an emission area EMA that allows light to be transmitted therethrough or emits light.

As illustrated in FIGS. 5 and 6A, the mirror function display panel 150 may serve as a mirror when not driven. Meanwhile, when driven, the mirror function display panel 150 may serve as a display for displaying information or an image such as A to D in a partial region thereof.

As illustrated in FIG. 6, the mirror function display panel 150 may also serve as a display for displaying information or an image such as A to D in the partial region. Also, as illustrated in FIG. 7, the display panel 150 having a mirror function may also serve as a display for displaying information or an image such as A to D in the entire region. In addition, the mirror function display panel 150 may be implemented in various forms such as implementing a mirror function and a display function harmoniously on the entire screen.

Figure 8:
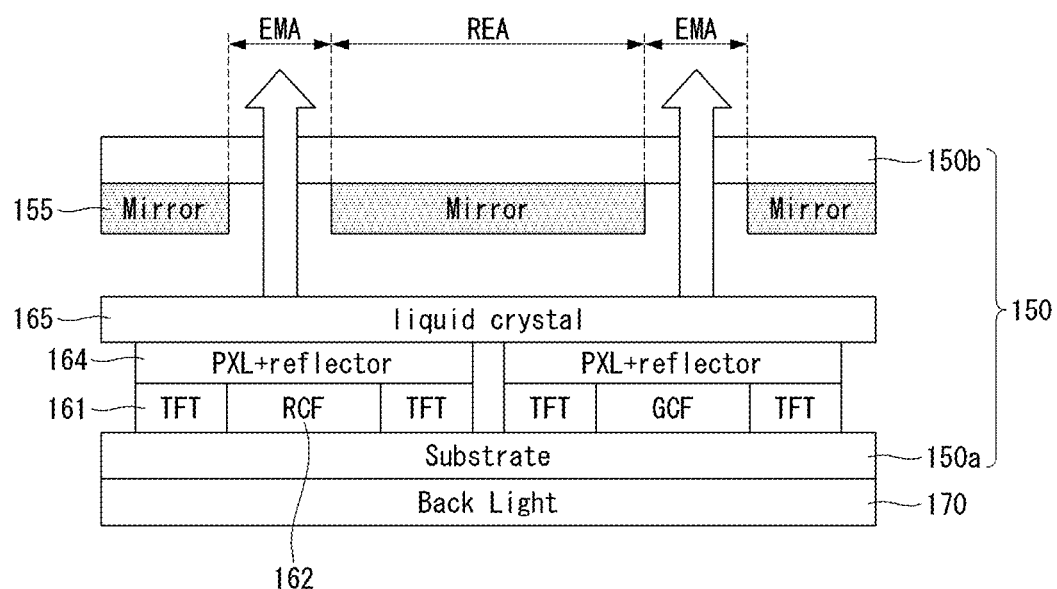
FIG. 8 is a view illustrating a first example of a mirror function display panel.
Figure 9:
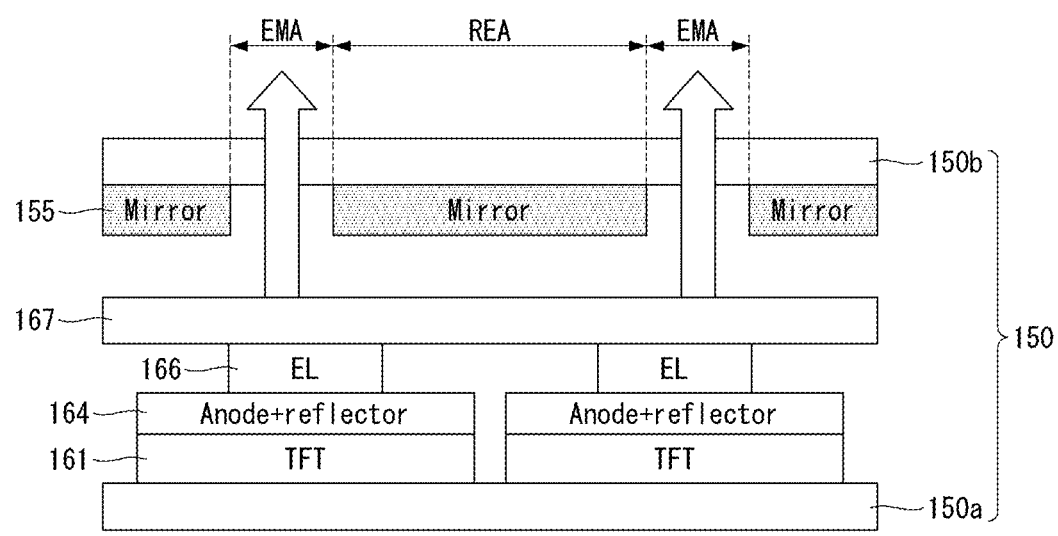
FIG. 9 is a view illustrating a second example of a mirror function display panel.

FIG. 8 is a view illustrating a first example of a mirror function display panel, FIG. 9 is a view illustrating a second example of a mirror function display panel, and FIG. 10 is a view illustrating a shape of a subpixel included in a mirror function display panel.

As illustrated in FIG. 8, the mirror function display panel 150 may be implemented based on a liquid crystal layer. The mirror function display panel 150 based on the liquid crystal layer includes a first substrate 150a, a transistor portion 161, a color filter portion 162, an electrode portion 164, a liquid crystal layer 165, a mirror portion 155, a second substrate 150b, and a backlight unit 170 for providing light.

In the illustrated example, the transistor portion 161 and the color filter portion 162 are arranged on one surface of the first substrate 150a, and the electrode portion 164 including a pixel electrode, a reflector, a common electrode, and the like, is positioned thereon, the liquid crystal layer 165 is positioned thereon, and the mirror portion 155 is divided and positioned on one surface of the second substrate 150b.

However, FIG. 8 is merely an example and the structure of the mirror function display panel 150 based on the liquid crystal layer is not limited thereto and may be implemented in various forms. For example, the color filter portion 162, which is a portion converting light exiting from the backlight unit 170 into red, green, and blue light, may be positioned on the transistor portion 161 or may be positioned on one surface of the second substrate 150b.

As illustrated in FIG. 9, the mirror function display panel 150 may be implemented based on a light emitting diode. The mirror function display panel 150 based on the light emitting diode includes a first substrate 150a, a transistor portion 161, a first electrode portion 164, a light emitting layer 166, a second electrode portion 167, a mirror portion 155, and a second substrate 150b.

In the illustrated example, the transistor portion 161 is positioned on one surface of the first substrate 150a, the first electrode portion 164 including an anode and a reflector is positioned on the transistor portion 161, the light emitting layer 166 is positioned on the first electrode portion 164, the second electrode portion 167 is disposed on the light emitting layer 166, and the mirror portion 155 is positioned and divided on one surface of the second substrate 150b.

However, FIG. 9 is merely an example, and the structure of the mirror function display panel 150 based on the light emitting diode is not limited thereto and may be implemented in various forms. For example, when the light emitting diode 166 emits white light, a color filter portion for converting the white light into red, green, and blue light may further be provided. The color filter portion may be positioned on the transistor portion 161 or on one surface of the second substrate 150b as with the mirror portion 155.

As can be seen from FIGS. 8 and 9, the mirror function display panel 150 includes a reflective area REA in which the mirror portion 155 is positioned and an emission area EMA, in which the mirror portion 155 is not positioned, which allows light to be transmitted therethrough or which emits light.

As illustrated in FIG. 10, the mirror function display panel based on the liquid crystal layer or the light emitting diode may have subpixels implemented in various shapes corresponding to a purpose or characteristics of an implemented device.

Figure 10A:
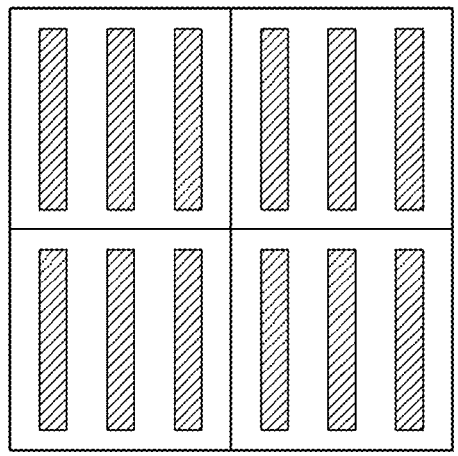
FIGS. 10A-10D is a view illustrating a shape of a subpixel included in a mirror function display panel.
Figure 10B:
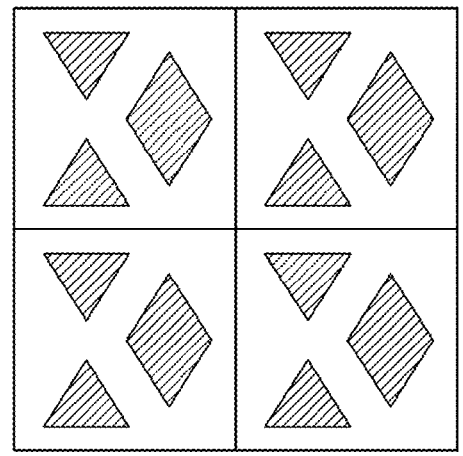
Figure 10C:
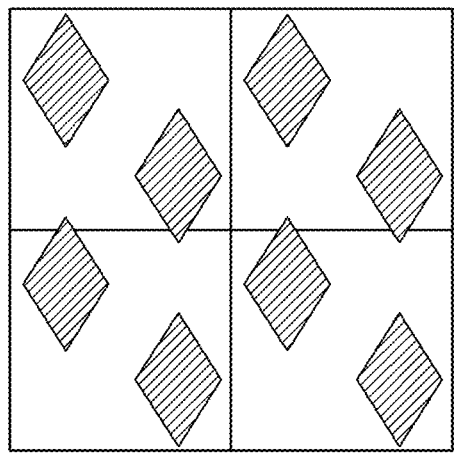
Figure 10D:
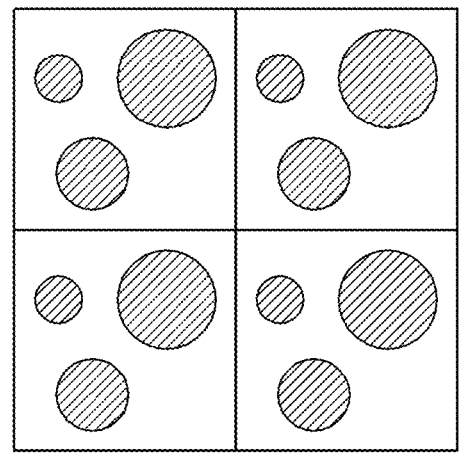

For example, in a plan view, the subpixels may have at least one of a rectangular shape (general shape) as illustrated in FIG. 10A, a mixture of a triangle and a diamond shape as illustrated in FIG. 10B, a diamond shape as illustrated in FIG. 10C, and a circular shape (a combination of circles having the same size or different sizes) as illustrated in FIG. 10D, but the present disclosure is not limited thereto.

Although the present disclosure is applicable to the mirror function display panel based on the liquid crystal layer or the light emitting diode, the mirror function display panel based on the light emitting diode will be described as an example in the following description.

Figure 11:
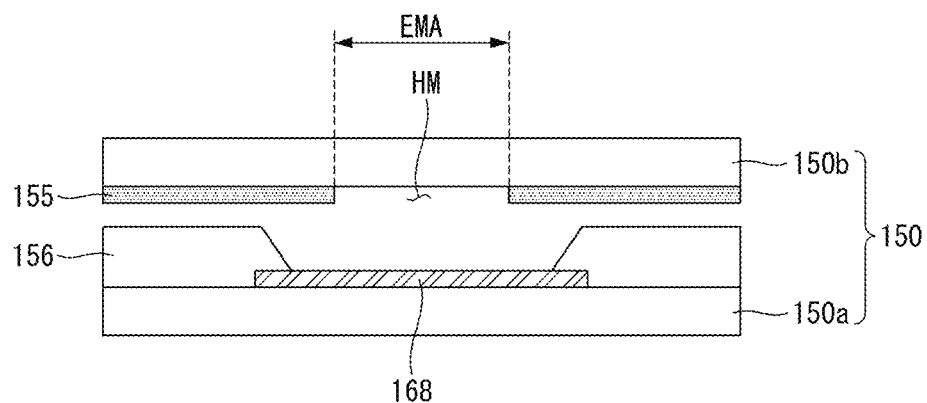
FIG. 11 is a cross-sectional view of a periphery of a light emitting region according to an experimental example.
Figure 12:
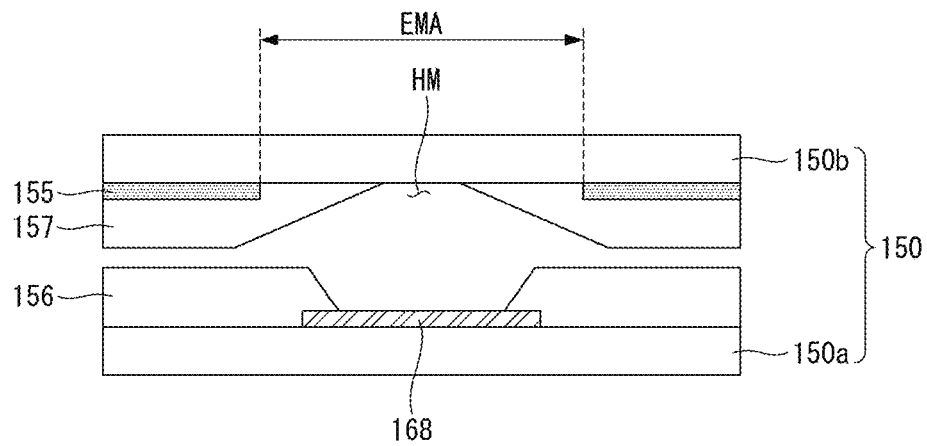
FIG. 12 is a cross-sectional view of a periphery of a light emitting region according to a first example of the present disclosure.
Figure 13:
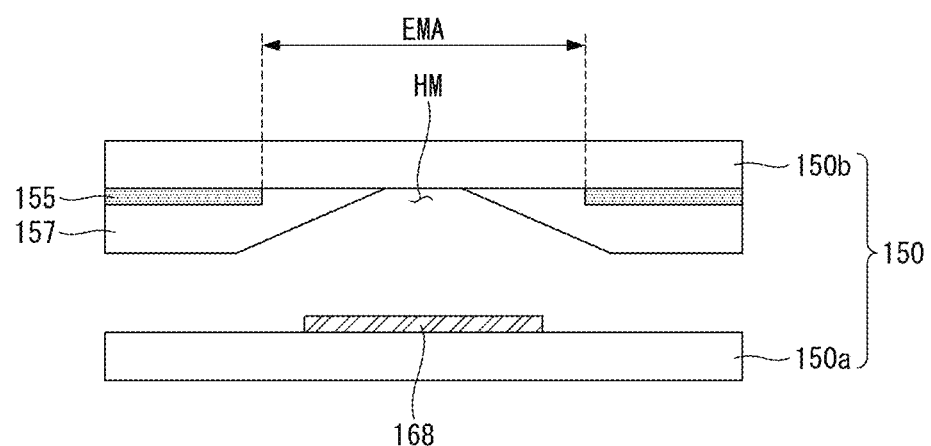
FIG. 13 is a cross-sectional view of a periphery of a light emitting region according to a second example of the present disclosure.

FIG. 11 is a cross-sectional view of a periphery of a light emitting region according to an experimental example, FIG. 12 is a cross-sectional view of a periphery of a light emitting region according to a first example of the present disclosure, FIG. 13 is a cross-sectional view of a periphery of a light emitting region according to a second example of the present disclosure, and FIGS. 14 to 16 are views illustrating a structure of a cover layer.

As illustrated in FIGS. 11 and 12, unlike the experimental example, the embodiment includes a cover layer 157 covering the mirror portion 155 on one surface (facing the first substrate) of the second substrate 150b. Like the experimental example, the embodiment may have a bank layer 156 covering a portion of the light emitting portion 168 positioned on one surface of the first substrate 150a or the bank layer 156 may be omitted. The illustrated light emitting portion 168 refers to a light emitting diode that emits light. The emission area EMA corresponding to a light exiting region is defined by an opening HM of the mirror portion 155.

The cover layer 157 covers a portion of the opening HM provided by the mirror portion 155. The cover layer 157 has a substantially flat surface like the mirror portion 155 but gradually decreases in thickness toward a region covering the opening HM provided by the mirror portion 155. The thickness of the cover layer 157 decreases toward the center of the opening HM of the mirror portion 155 or may be tapered toward the center of the opening HM of the mirror portion 155.

The cover layer 157 may have different thicknesses at different locations. The cover layer 157 has a first region I overlapping the second substrate 150b and a second region II overlapping the mirror portion 155. A first location A and a second location B are in the first region I, and a third location C and a fourth location D are in the second region II. The cover layer 157 has a first thickness at the first location A, a second thickness at the second location B, a third thickness at the third location C, and a fourth thickness at the fourth location D.

Figure 14A:
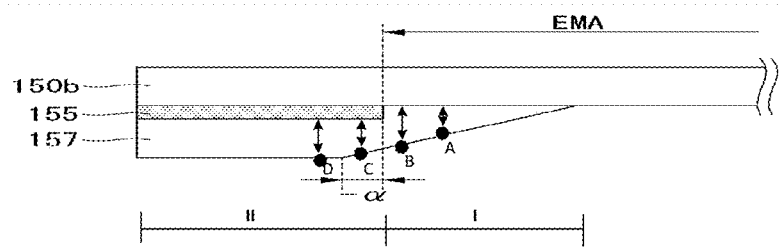
FIGS. 14A-14C, 15A-15C, and 16A-16C are views illustrating a structure of a cover layer.

As illustrated in FIG. 14A, a slope of the cover layer 157 may be formed before the end of the mirror portion 155 (the point where the opening starts). That is, the cover layer 157 may have a gradient sloped from a minus alpha (−α) point against the end of the mirror portion 155 in the second region II. In an example shown in FIG. 14A, the second thickness at location B is greater than the first thickness at location A. The fourth thickness at location D is greater than the third thickness at location C. A distance between a surface of the cover layer 157 facing the first substrate 150a and a surface of the second substrate 150b at location C is greater than a distance between a surface of the cover layer 157 facing the first substrate 150a and a surface of the second substrate 150b at location B.

Figure 14B:
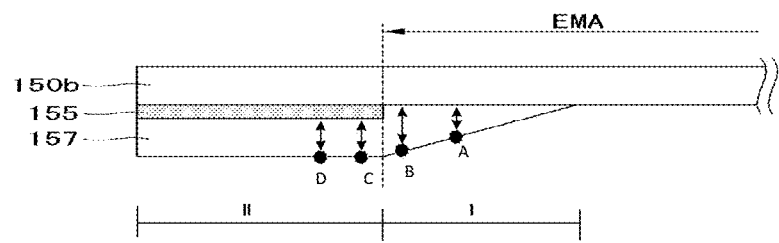

As illustrated in FIG. 14B, the slope of the cover layer 157 may be formed to correspond to the end of the mirror portion 155 (the point where the opening starts). That is, the cover layer 157 may have a gradient sloped from the same point as the end of the mirror portion 155 at a boundary between the first region and the second region. In an example shown in FIG. 14B, the second thickness at location B is greater than the first thickness at location A. The third thickness at location C is substantially the same as the fourth thickness at location D. A distance between a surface of the cover layer 157 facing the first substrate 150a and a surface of the second substrate 150 at locations C and D are the same, and such distance at location C is greater than a distance between a surface of the cover layer 157 facing the first substrate 150a and a surface of the second substrate 150 at locations A and B.

Figure 14C:
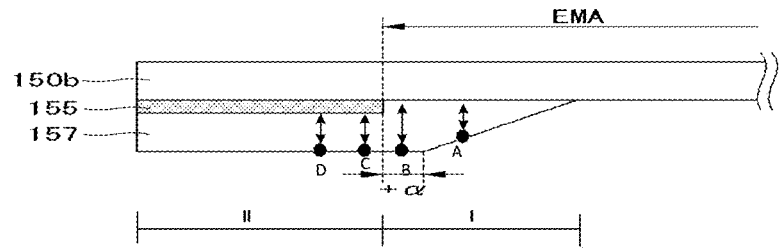

As illustrated in FIG. 14C, the slope of the cover layer 157 may be formed after the end of the mirror portion 155 (the point where the opening starts). That is, the cover layer 157 may have a gradient sloped from a plus alpha (+alpha) point against the end of the mirror portion 155 in the first region. In an example shown in FIG. 14C, the second thickness at location B is greater than the first thickness at location A. The third thickness at location C and the fourth thickness at location D are substantially the same. A distance between a surface of the cover layer 157 facing the first substrate 150a and a surface of the second substrate 150 at locations B, C, and D are substantially the same, and such distance at locations B, C, and D is greater than a distance between a surface of the cover layer 157 facing the first substrate 150a and a surface of the second substrate 150 at location A.

Figure 15A:
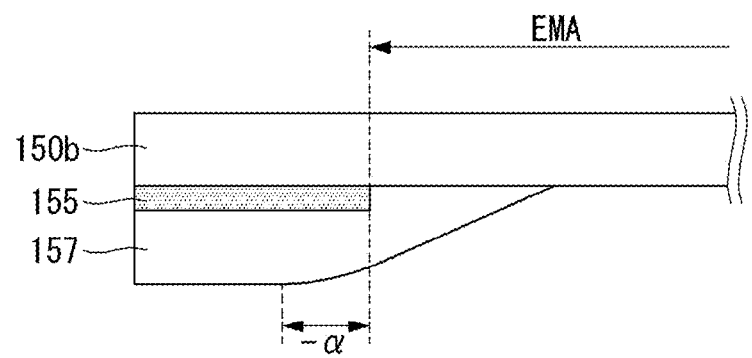

As illustrated in FIG. 15A, the slope of the cover layer 157 may be formed before the end of the mirror portion 155 (the portion where the opening starts), but a starting point of the slope may have a rounded shape, rather than being angulated. That is, the cover layer 157 may have a gradient sloped from a minus alpha (−α) point against the end of the mirror portion 155 similarly to FIG. 14A but without an angled portion.

Figure 15B:
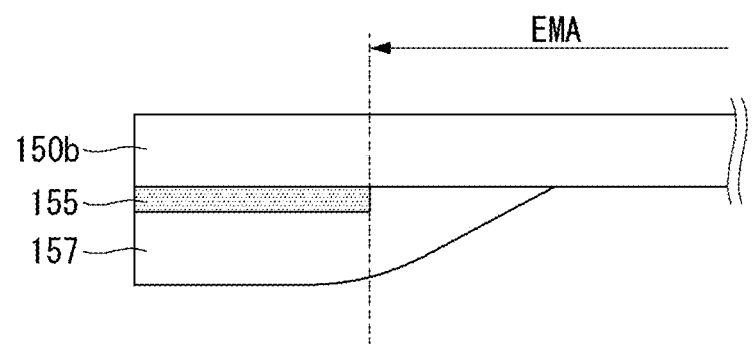

As illustrated in FIG. 15B, the slope of the cover layer 157 may be formed to correspond to the end of the mirror portion 155 (the portion where the opening starts) but a starting point of the slope has a rounded shape, without being angulated. That is, similar to FIG. 14B, the cover layer 157 may have the gradient sloped from the sample as the end of the mirror portion 155 but without an angled portion.

Figure 15C:
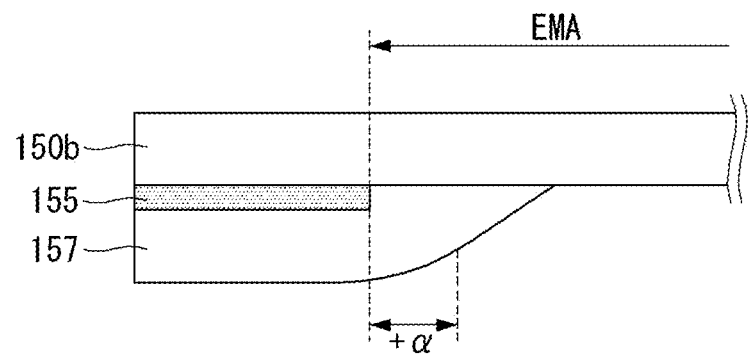

As illustrated in FIG. 15C, the slope of the cover layer 157 may be formed after the end of the mirror portion 155 (the portion where the opening starts) but the starting point of the slope may have a rounded shape without being angulated. That is, similar to FIG. 14c, the cover layer 157 may have a gradient sloped a plus alpha (+α) against the end of the mirror portion 155 but without an angled portion.

Figure 16A:
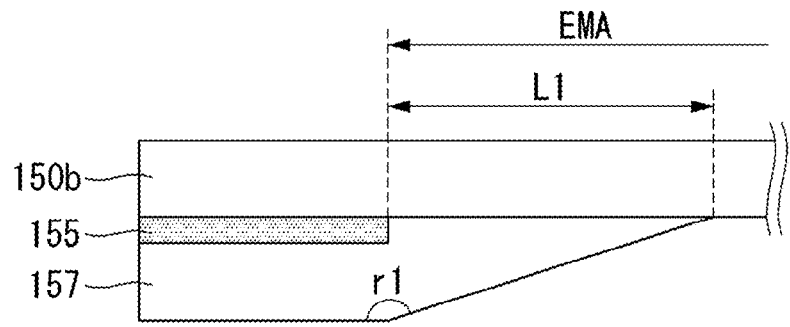
Figure 16B:
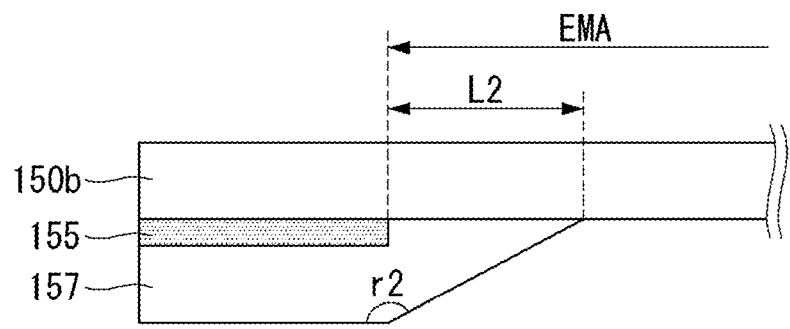
Figure 16C:
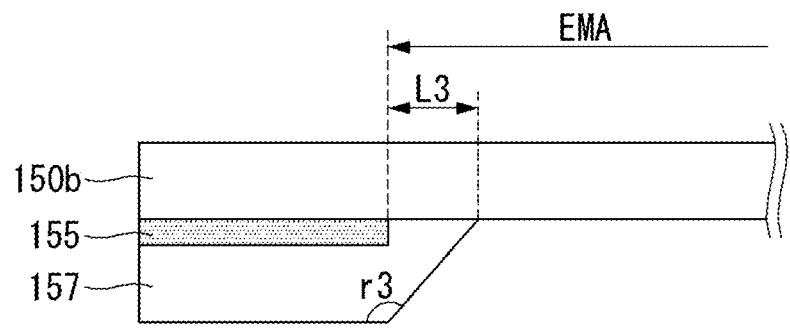

As can be seen from FIGS. 16A to 16C, the cover layer 157 may have sloped portions covering the emission area EMA whose lengths L1, L2, and L3 are long or short (long tail or short tail) depending on angles r1, r2, and r3 at which the slopes start, respectively. However, this is merely an example and the cover layer 157 may vary depending on a material used to form the cover layer 157, an etching material for patterning the cover layer 157, and the like.

Figure 17:
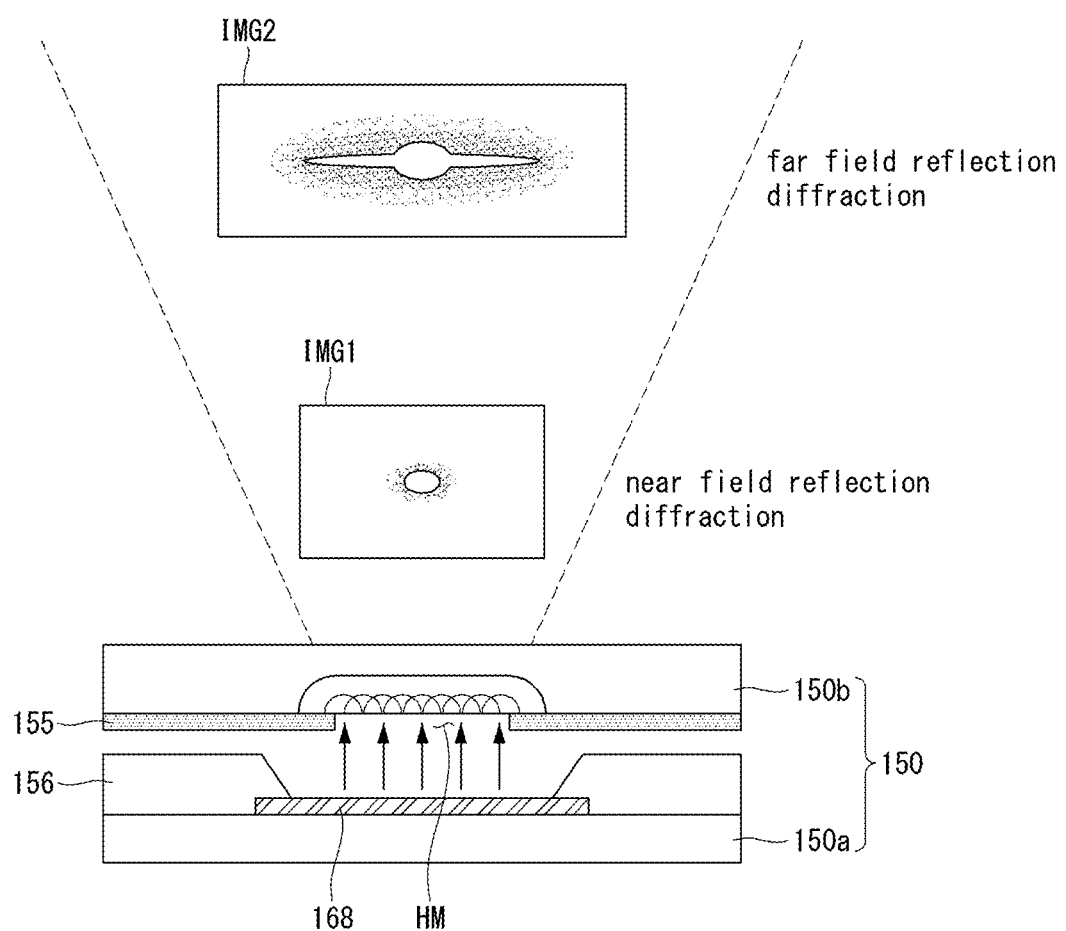
FIG. 17 is a view illustrating the results of near-field and far-field diffraction experiments of an experimental example.
Figure 18:
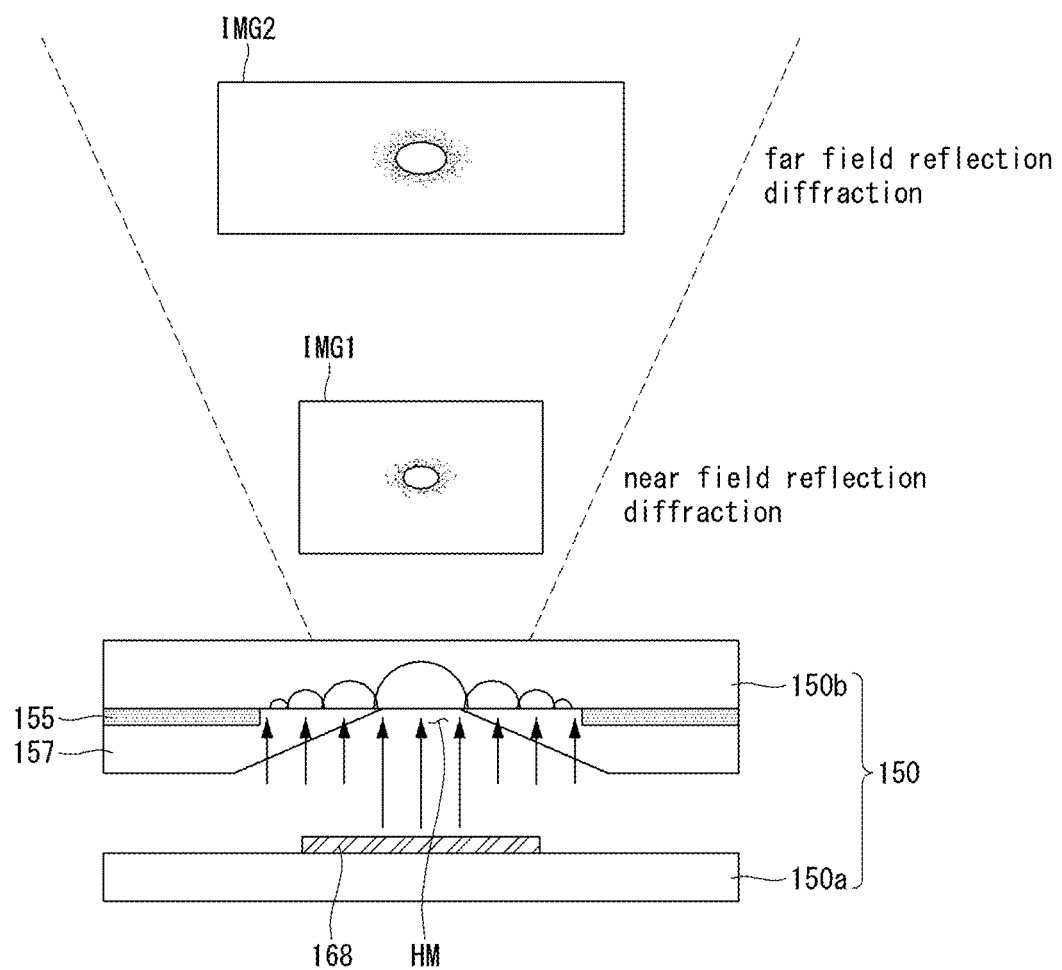
FIG. 18 is a view illustrating the results of near-field and far-field diffraction experiments of an embodiment.
Figure 19:
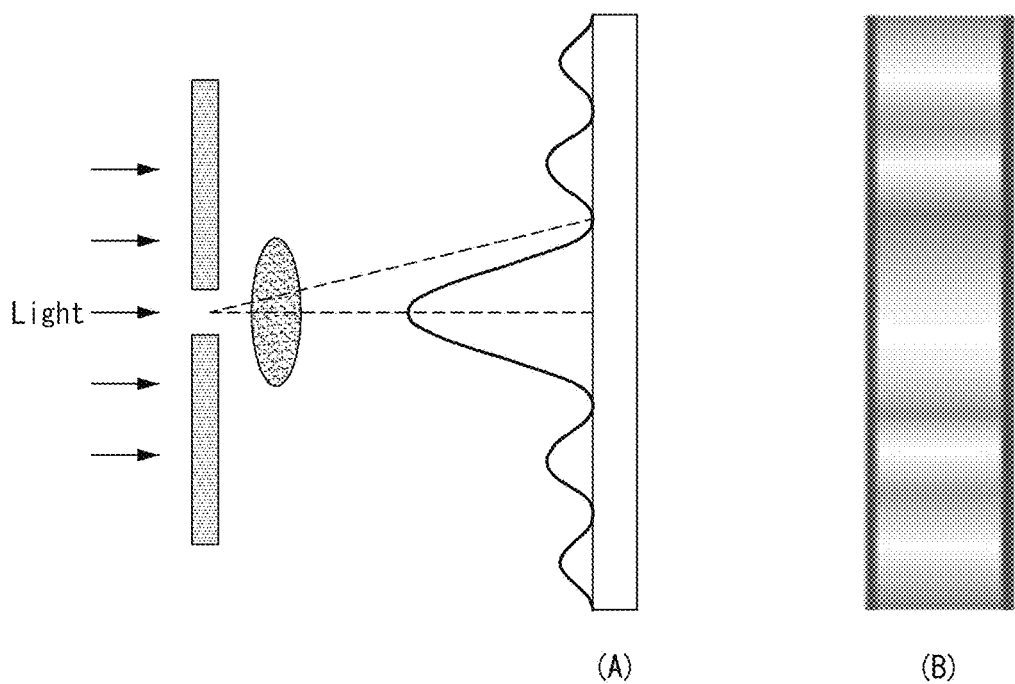
FIG. 19 is a view illustrating a principle related to generation of a far-field diffraction pattern by a single slit.

FIG. 17 is a view illustrating the results of near-field and far-field diffraction experiments of an experimental example, FIG. 18 is a view illustrating the results of near-field and far-field diffraction experiments of an embodiment, and FIG. 19 is a view illustrating a principle related to generation of a far-field diffraction pattern by a single slit.

As illustrated in FIG. 17, in an experimental example, light is emitted through the opening HM of the mirror portion 155 present on one surface of the second substrate 150b. As illustrated in FIG. 18, light is emitted through the opening HM of the mirror portion 155 present on one surface of the second substrate 150b, but a partial amount of light is absorbed by the cover layer 157 and transmittance is varied.

As can be seen from the comparison of IMG1 and IMG2 (IMG1 and IMG2 are the results obtained by shaping the light emitted in the corresponding region) as experimental results observed in the emission area of FIGS. 17 and 18, the embodiment may have a reduced influence of reflection and diffraction compared with the experimental example. Specifically, in the embodiment, diffraction that occurs at the end of the opening HM of the mirror portion 155 may be reduced. This will be described hereinafter.

As illustrated in FIG. 19, when light passes from one side to the other through a single slit (corresponding to the opening of the mirror portion), a diffraction pattern is formed. The principle in which these patterns are formed is based on the Huygens principle (each point on a wavefront-in-phase plane of light is considered as a fresh source of waveforms spreading in all directions at a ratio associated with a velocity thereof).

In the experiment example illustrated in FIG. 17, when light exiting after being reflected from the reflector included in the light emitting part passes through the opening HM of the mirror portion 155, interference occurs due to wave nature of light to form a diffraction pattern according to the principle described above with reference to FIG. 19.

In contrast, in the embodiment of FIG. 18, since light exiting after being reflected from the reflector included in the light emitting portion is partially absorbed by the cover layer 157 covering the opening HM of the mirror portion 155 and transmittance is varied, the cause of interference of light and the diffraction pattern are considerably removed. Meanwhile, in the present disclosure, the expression of absorbing light at the end of the mirror portion and varying the transmittance is used, but since diffraction is canceled out accordingly, the cover layer 157 may be termed a structure for canceling out the diffraction.

Figure 21:
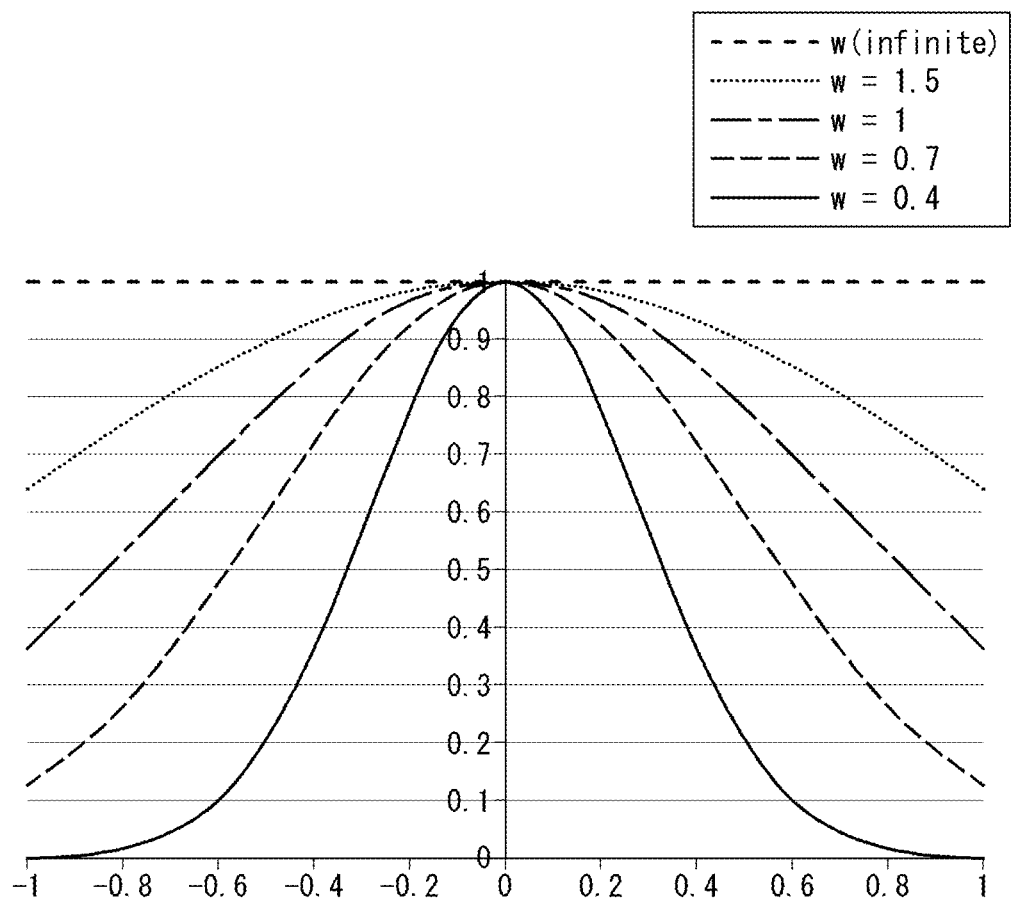
FIG. 21 is a graph illustrating an optical profile.
Figure 22:
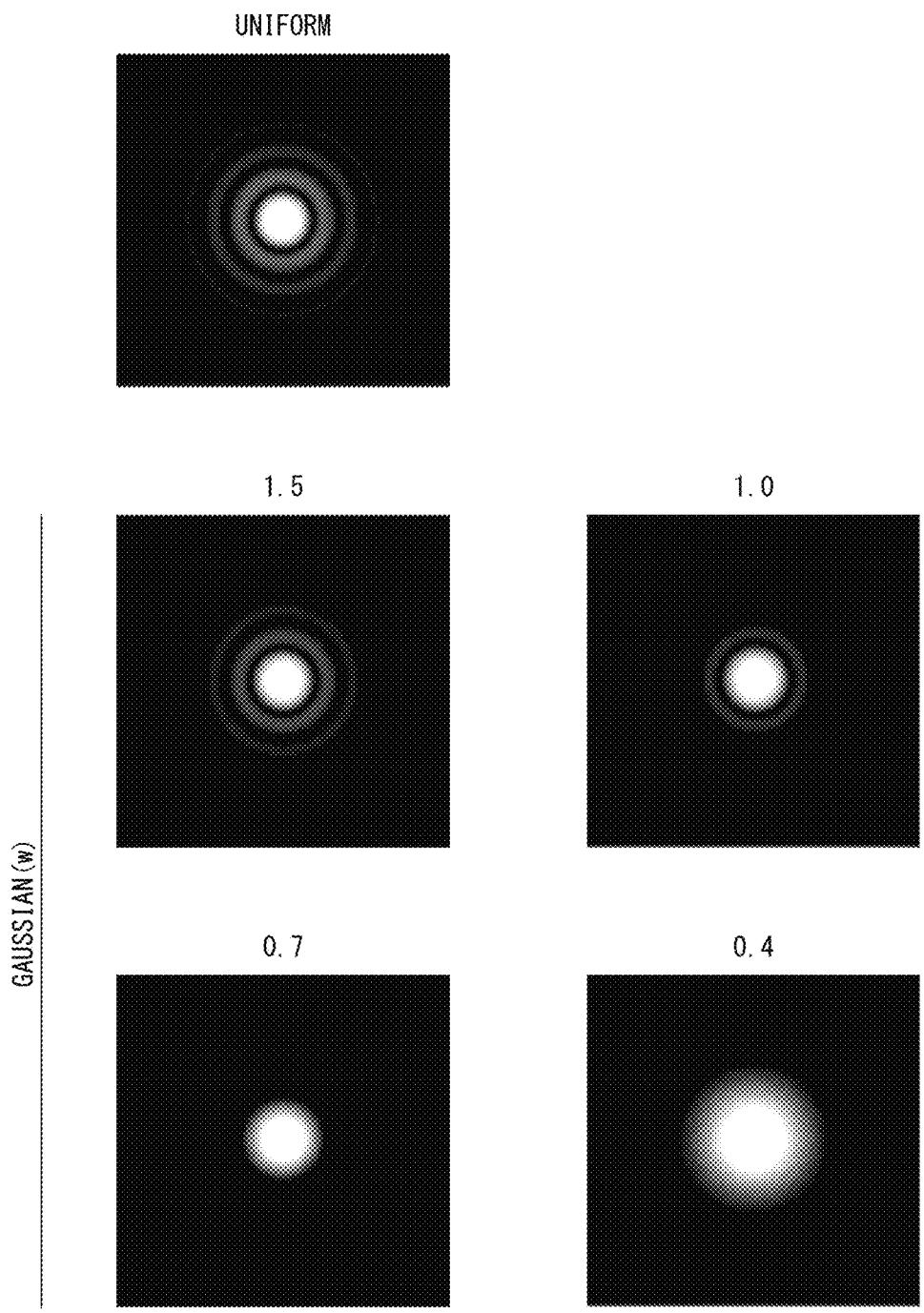
FIG. 22 is a view illustrating an aspect of diffraction according to a value w in FIG. 21.
Figure 23:
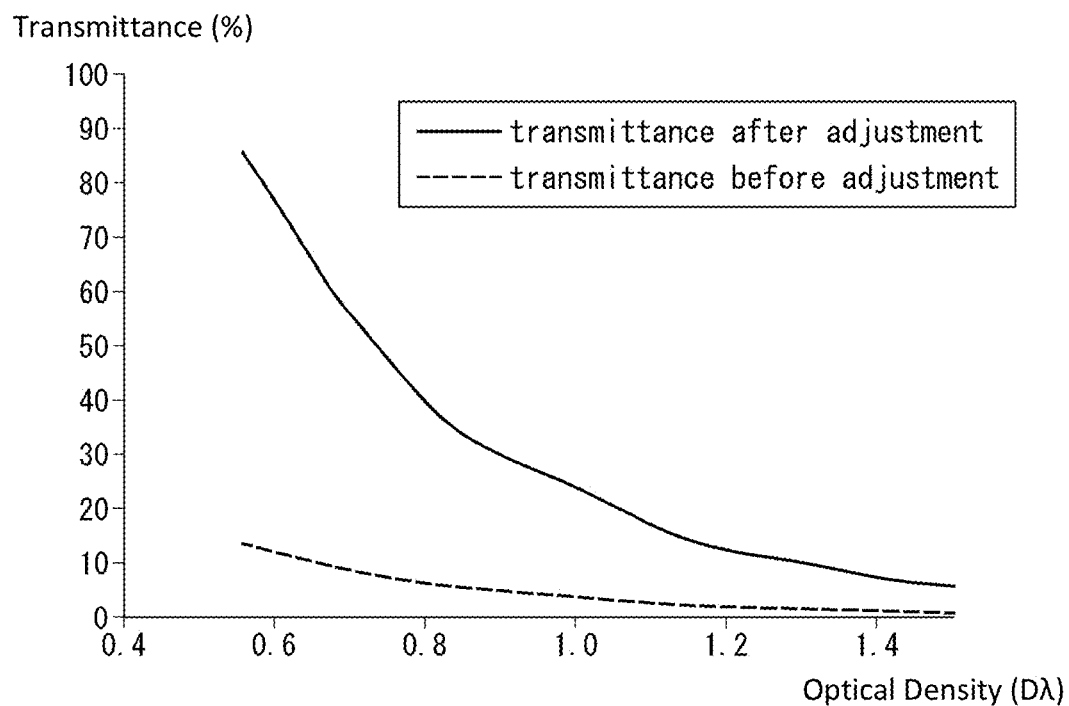
FIG. 23 is a graph illustrating a change in transmittance according to a change in thickness of a cover layer.
Figure 24:
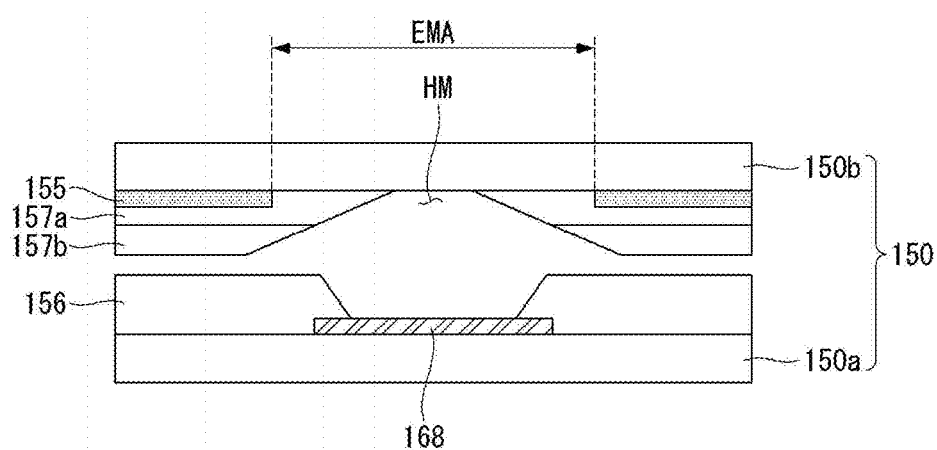
FIG. 24 is a cross-sectional view of a cover layer having a multilayer structure.

FIG. 20 are planar and cross-sectional views of two types of cover layers, FIG. 21 is a graph illustrating an optical profile, FIG. 22 is a view illustrating an aspect of diffraction according to a value w in FIG. 21, FIG. 23 is a graph illustrating a change in transmittance according to a change in thickness of a cover layer, and FIG. 24 is a cross-sectional view of a cover layer having a multilayer structure. In the graph of FIG. 21, the X axis is w described hereinafter, the Y axis is beam intensity, and in the graph of FIG. 23, the X axis is optical density (Dλ) and the Y axis is transmittance (%).

As illustrated in FIG. 20A, the cover layer 157 may have a circular shape and have a linear gradient and a thickness decreasing toward the opening HM. Also, as illustrated in FIG. 20B, the cover layer 157 may have a circular shape and a stepped gradient and a thickness decreasing toward the opening HM. Here, the cover layer 157 has a circular shape, for example, and is not limited thereto.

Regarding the structure of the cover layer 157, an optimal ratio that may reduce the influence of diffraction may be found based on a Gaussian beam profile. This will be described with reference to the graph of FIG. 21.

The equation of a normal Gaussian beam is represented by $A=\exp(-r/w)^2$. In this equation, r corresponds to a starting point-center point (hole radius) of the opening HM and w corresponds to an end point-enter point (Gaussian radius) of the cover layer 157.

As can be seen from the optical profile graph of FIG. 21, the diffraction pattern of FIG. 22, and the transmittance change graph of FIG. 23, the diffraction starts to disappear when the ratio of r to w is about 0.7. Therefore, when the cover layer 157 having a gradient is formed on the opening HM as illustrated in FIG. 20A, the far field and near field diffraction problems may be minimized or prevented.

As illustrated in FIG. 20B, when transmittance of light is adjusted by varying the shape (e.g., stepped shape) of the end of the cover layer 157, the diffraction problem is minimized or prevented by secondary and tertiary peaks.

Meanwhile, experiment showed that the best results were obtained when the cover layer 157 had a circular shape and had a transmittance gradation ranging from 30% to 40% (transmittance gradation range at the distance from the center of the circular shape to the end of the circular shape).

In order to smoothly perform the above function, the cover layer 157 may be selected as a single layer or include multiple layers formed of an organic material, an inorganic material, or a metal material. In addition, the cover layer 157 may include a material of black pigment in order to enhance light absorption capability.

For example, when a black-based organic material is selected as a material of the cover layer 157, a method of reflowing after post baking or using a half-tone mask at the time of exposure may be used but the present disclosure is not limited thereto. When an organic material is selected, a method of forming a photoresist having a homogeneous or heterogeneous color as multiple layers (double or triple layers) 157a and 157b as illustrated in FIG. 24 may also be used.

The organic material is advantageous to varying a gradient so as to be freely deformed in thickness, and also, it is advantageous to shape working using a half-tone mask or the like, after multiple layers are formed.

Meanwhile, the inorganic material or the metal material is not as free of shape as the organic material, and thus, instead of limiting the thickness or the gradient of the cover layer, a method of adding a pattern such as forming a micro hole pattern may be used as described hereinafter.

Figure 25:
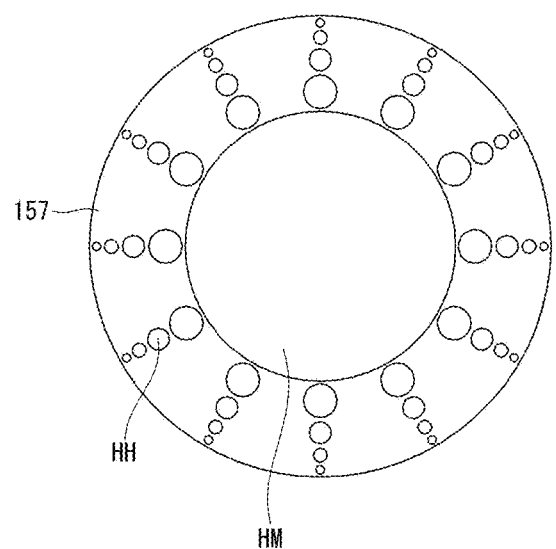
FIGS. 25 to 27 illustrate other forms of a cover layer.
Figure 26:
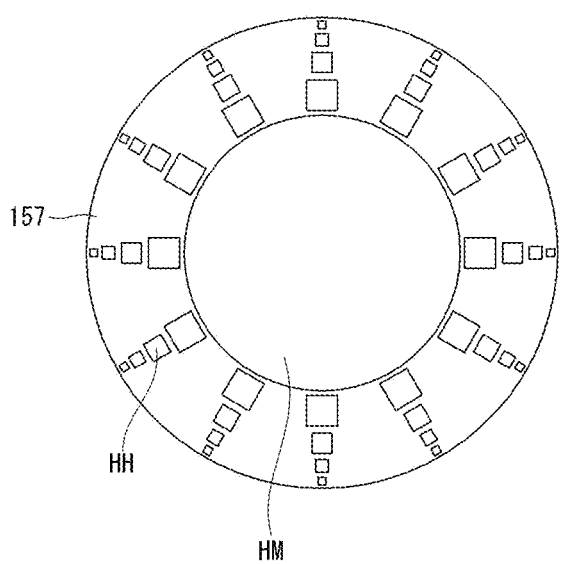
Figure 27:
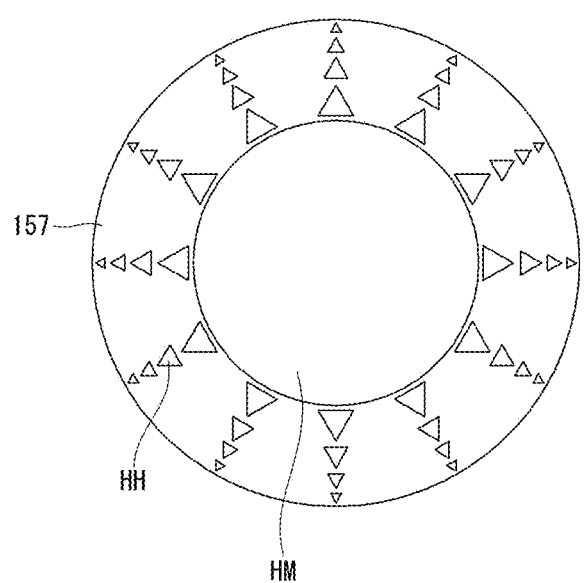

FIGS. 25 to 27 illustrate other forms of a cover layer.

As illustrated in FIGS. 25 to 27, when the cover layer 157 is formed of an inorganic material or a metal material, fine opening patterns HH may be added in an area covering the opening HM. The cover layer 157 may have a same thickness in a portion overlapping the second substrate 150b as a portion overlapping the mirror portion 155.

Sizes of the fine opening patterns HH increase in a direction toward the center of the opening HM and decrease in a direction away from the center of the opening HM. When the sizes of the fine opening patterns HH are formed in this manner (the openings are gradually increased and decreased), transmittance of light may be varied without having to adjust a thickness of the cover layer 157. That is, the cover layer 157 having the fine opening patterns HH may exhibit characteristics similar to the cover layer 157 having the linear gradient and reduced in thickness as illustrated in FIG. 20A and the cover layer 157 having the stepped gradient and reduced in thickness as illustrated in FIG. 20B.

Although the example of the fine opening patterns HH having three types of shapes, i.e., a circular shape as illustrated in FIG. 25, a quadrangular shape as illustrated in FIG. 26, and a triangular shape as illustrated in FIG. 27 is illustrated, but the present disclosure is not limited thereto and a form corresponding to a shape of the opening HM such as an oval shape, a polygonal shape, and the like, may also be selected. In addition, the shape of the fine opening patterns HH may be selected to be different from the shape of the opening HM in consideration of a shape of the subpixels or light emission characteristics (R, G, B luminous efficiency, etc.) of the subpixels.

Figure 28:
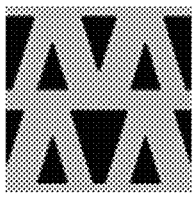
FIG. 28 is a view illustrating shapes of mirror portions according to an experimental example and simulation results thereof.
Figure 28:
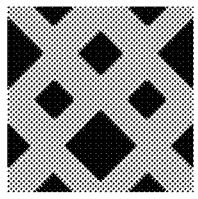
Figure 28:
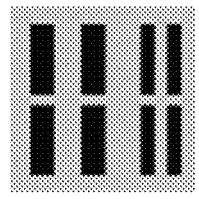
Figure 28:
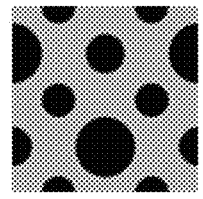
Figure 28:
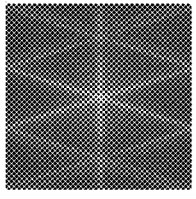
Figure 28:
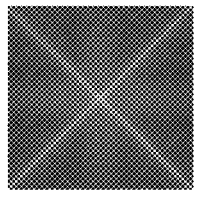
Figure 28:
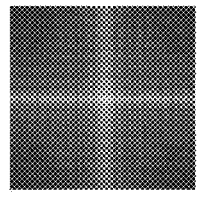
Figure 28:
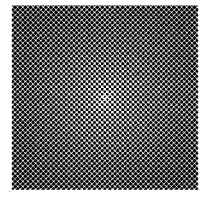
Figure 29:
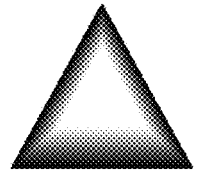
FIG. 29 is a view illustrating shapes of mirror portions according to an embodiment and simulation results thereof.
Figure 29:
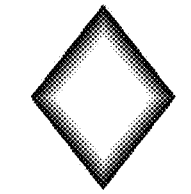
Figure 29:
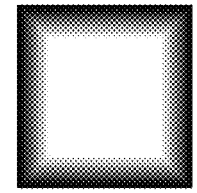
Figure 29:
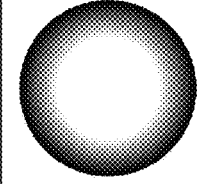
Figure 29:
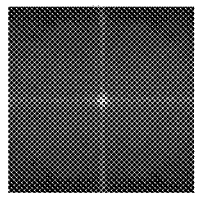
Figure 29:
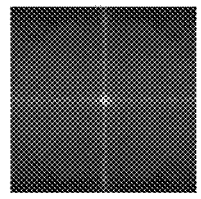
Figure 29:
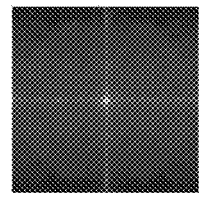
Figure 29:
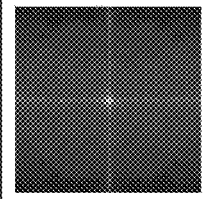

FIG. 28 is a view illustrating shapes of mirror portions according to an experimental example and simulation results thereof, and FIG. 29 is a view illustrating shapes of mirror portions according to an embodiment and simulation results thereof (The simulation results of FIGS. 28 and 29 are obtained by imaging the result of two-dimensional Fourier transforming of light extracted through the opening to indirectly show how the diffraction patterns of the experimental example and the embodiment were changed).

As illustrated in FIG. 28, the mirror portions (upper plate mirror structure) according to the experimental example have a triangular shape, a diamond shape, a rectangular shape, and a circular shape.

As illustrated in FIG. 29, the mirror portions (top plate mirror structure) according to the embodiment also have a triangular shape, a diamond shape, a rectangular shape, and a circular shape. Here, only the shapes of the mirror portions (top plate mirror structure) according to the embodiment are the same as those of the experimental example, and the structure of the mirror portions of the embodiment has a linear gradient and a reduced thickness as described above. (In the embodiment of FIG. 29, only one figure is illustrated for each shape in order to clearly show differences compared with the experimental example).

According to the simulation results between the experimental example and the embodiment, it can be seen that, when the cover layers having the shapes as in the embodiment are formed in the opening, light generated in the vicinity of the end of the mirror portion may be absorbed to change transmittance, whereby far field and near field diffraction problems may be minimized or prevented.

As described above, in the present disclosure, the diffraction and transmission diffraction that occur in near field and far field on the light transmission region or the light emission region are minimized or prevented, thereby improving display quality of the display device having the mirror function. In addition, in the present disclosure, since the diffraction problem is minimized or prevented, a mirror function and a display function may be implemented harmoniously.

What is claimed is:

1. A display device comprising:
 a first substrate;
 a light emitting portion on a surface of the first substrate;
 a second substrate;
 a mirror portion on a surface of the second substrate facing the first substrate, the mirror portion having an opening overlapping the light emitting portion; and
 a cover layer, wherein a first part of the cover layer is on the surface of the second substrate facing the first substrate and covers a first portion of the opening but does not cover a second portion of the opening.

2. The display device of claim 1, wherein a second part of the cover layer is on a surface of the mirror portion facing the first substrate, the second part of the cover layer having a substantially flat surface and the first part of the cover layer covering the first portion of the opening having a sloped surface.

3. The display device of claim 1, wherein a thickness of the first part of the cover layer gradually decreases toward a center region of the opening.

4. The display device of claim 1, wherein the first part of the cover layer has a stepped shape, and a thickness of the first part of the cover layer decreases toward a center region of the opening.

5. The display device of claim 1, wherein a thickness of the first part of the cover layer decreases toward a center region of the opening from a point overlapping with the mirror portion, a point at a boundary between the mirror portion and the second substrate, or a point beyond the boundary toward the center region of the opening.

6. The display device of claim 1, wherein the first part of the cover layer further includes a pattern of fine openings.

7. The display device of claim 6, wherein sizes of the fine openings increase toward a center region of the opening.

8. The display device of claim 1, wherein a shape of the cover layer in a plan view corresponds to a shape of the opening.

9. The display device of claim 1, wherein a shape of the cover layer in a plan view is one of circular, elliptical, triangular, quadrangular, and polygonal shapes or a combination thereof.

10. The display device of claim 1, wherein the cover layer comprises one or more layers, each of the one or more layers formed of an organic material, an inorganic material, or a metal material.

11. A display device comprising:
a first substrate;
a light emitting portion on a surface of the first substrate;
a second substrate;
a mirror portion on a surface of the second substrate facing the first substrate, the mirror portion having an opening overlapping the light emitting portion; and
a cover layer with a first region on the second substrate and a second region on the mirror portion, wherein the cover layer has a first thickness at a first location and a second thickness at a second location farther from a center region of the opening than the first location, wherein the first region on the second substrate covers a first portion of the opening but does not cover a second portion of the opening.

12. The display device of claim 11,
wherein the first location and the second location are in the first region, and the second thickness is equal or greater than the first thickness.

13. The display device of claim 12, wherein the cover layer has a third thickness at a third location and a fourth thickness at a fourth location farther from the center region of the opening than the third location, the third location and the fourth location in the second region, wherein the fourth thickness is greater than the third thickness.

14. The display device of claim 12, wherein the cover layer has a third thickness at a third location and a fourth thickness at a fourth location farther from the center region of the opening than the third location, the third location and the fourth location in the second region, wherein the fourth thickness is equal to the third thickness.

15. The display device of claim 14, wherein a distance between the surface of the second substrate facing the first substrate and a surface of the cover layer is substantially equal at the second location, the third location, and the fourth location.

16. The display device of claim 12, wherein the cover layer further includes a pattern of fine openings in the first region, sizes of the fine openings increasing toward a center region of the opening.

17. A display device comprising a plurality of subpixels, each subpixel comprising:
an emission area for emitting light; and
a reflective area surrounding the emission area,
wherein the reflective area includes a mirror portion, and the emission area includes an opening in the mirror portion, and
wherein a cover layer is on at least a portion of the mirror portion and extends into the opening to overlap with a first portion of the emission area but not with a second portion of the emission area.

18. The display device of claim 17, wherein the cover layer has a step shape, and a thickness of the cover layer decreases toward a center region of the opening.

19. The display device of claim 17, wherein a thickness of the cover layer decreases toward a center region of the opening from a point overlapping with the reflective area, a point at a boundary between the reflective area and the emission area, or a point beyond the boundary toward the center region.

20. The display device of claim 17, wherein the cover layer further includes a pattern of fine openings in a part extending into the opening to overlap with the first portion of the emission area.

* * * * *